United States Patent [19]

Fleming et al.

[11] Patent Number: 5,209,815
[45] Date of Patent: May 11, 1993

[54] METHOD FOR FORMING PATTERNED FILMS ON A SUBSTRATE

[75] Inventors: Robert J. Fleming, Hopewell Junction; Margaret J. Lawson, Newburgh; Edward J. Leonard, Fishkill; Bryan N. Rhoads, Pine Bush, all of N.Y.

[73] Assignee: International Business Machines Corporation, Armonk, N.Y.

[21] Appl. No.: 711,224

[22] Filed: Jun. 6, 1991

[51] Int. Cl.$^5$ .......................................... H01L 21/00
[52] U.S. Cl. ..................... 156/629; 156/643; 156/644; 156/645; 156/652; 156/659.1; 156/661.1; 156/668
[58] Field of Search ............... 156/645, 644, 659.1, 156/643, 661.1, 668, 629, 633, 652, 234, 241, 151, 247; 437/203, 228; 427/96, 123, 124, 282, 272

[56] References Cited

U.S. PATENT DOCUMENTS

| | | | |
|---|---|---|---|
| 4,004,044 | 1/1977 | Franco | 427/43 |
| 4,410,622 | 10/1983 | Dalal | 430/312 |
| 4,465,538 | 8/1984 | Schmoock | 156/234 X |
| 4,803,181 | 2/1989 | Buchmann | 437/228 |
| 4,846,931 | 7/1989 | Gmitter et al. | 156/633 |
| 4,861,732 | 8/1989 | Fujimura | 437/229 |
| 4,869,760 | 9/1989 | Matsunami | 156/151 |
| 4,886,728 | 12/1989 | Salamy | 430/331 |
| 5,013,397 | 5/1991 | Tsukakoshi | 156/151 X |
| 5,037,504 | 8/1991 | Takeuchi | 156/151 X |
| 5,073,230 | 12/1991 | Maracas et al. | 156/633 X |

FOREIGN PATENT DOCUMENTS 2-139559  5/1990  Japan.
2-183255  7/1990  Japan.

OTHER PUBLICATIONS

IBM Technical Disclosure Bulletin, vol. 19 No. 4, Sep. 1976, "Stripping Promotor for Lift-off Mask", by P. Carr et al.

*Primary Examiner*—Thi Dang
*Attorney, Agent, or Firm*—Michael J. Balconi-Lamica; Richard A. Romanchik

[57] ABSTRACT

A method of forming patterned film onto a substrate includes the steps of: depositing a polyether sulfone release layer 50; depositing a photoresist underlayer 52; patterning a predetermined film pattern through the underlayer 52 and the polyether sulfone layer 50; depositing a film layer 60 onto the wafer, thereby forming a patterned film 62 on the substrate 10; weakening the mechanical bonding strength to the polyether sulfone release layer 50 by immersing it in NMP; stripping off layers 54 and 60 by applying an adhesive backed tape 64 to the top of the film layer and applying a pulling force; and, removing the polyether sulfone release layer 50 by immersing the wafer in a NMP bath.

18 Claims, 4 Drawing Sheets

METHOD FOR FORMING PATTERNED FILMS ON A SUBSTRATE

TECHNICAL FIELD OF THE INVENTION

The present invention relates to semiconductor manufacturing processes, and more particularly, the fabrication of patterned films on semiconductor substrates.

CROSS-REFERENCE

This Patent Application is related to U.S. patent application Ser. No. 07/711,228, entitled, "Method for Forming Patterned Films on a Substrate" which was filed concurrently on Jun. 6, 1991, and the disclosure of which is incorporated herein by reference.

BACKGROUND ART

The continuing improvements in semiconductor integrated circuit technology have resulted in the capability of forming increased numbers of transistors, resistors, etc., within a given semiconductor chip. For example, the advent of ion implantation has allowed devices to be smaller and improved masking and isolation techniques have allowed devices to be more closely spaced. This overall miniaturization effect has resulted in decreased cost and improved performance in integrated circuits. Unfortunately, though, many of the devices formed within the semiconductor chip must remain unused in the completed chip because of the lack of available space for wiring all of the circuits together.

For example, a practical state of the art integrated circuit chip containing between 700–2,000 circuits typically utilizes less than 50% of the available circuits. The principle reason for this is the inadequate space available on the surface of the chip for wiring all of the circuits. The interconnection metallurgy system atop the chip is extremely complex and bulky, requiring the spacing between the wires to be very tight. To achieve even a 50% efficiency of circuit utilization, at least 2 or 3 and possibly 4 separate levels of complex conductive wiring patterns, each separated by one or more layers of dielectric material, are used.

One solution to solving the above mentioned interconnection wiring problem is found in advanced bipolar semiconductor products, wherein metal studs are employed to provide contact between circuit components and their interconnect wiring. These metal studs are essential for efficient utilization of chip real estate and in maintaining a planar wiring structure essential for both high performance and reliability. The relatively small diameter and large height of the contact stud, however, imposes particular problems and therefore limits the number of methods suitable for their construction. A prior technique for forming metal studs of this nature is disclosed in commonly owned U.S. Pat. No. 4,410,622 (Dalal, et al.). FIGS. 1A–1D provide a simplified illustration of the method for forming metal contact studs atop a semiconductor substrate according to Dalal et al. First, a polyether sulfone layer is deposited on top of the substrate, followed by the deposition of an organic polymer material such as a novolak resin based (NVR) positive resist. The NVR layer is then baked to 200° C. to render it photoinsensitive. A photosensitive resist layer is then deposited on the NVR layer, and a pattern is transferred to the substrate by exposing the pattern through the photoresist material and then etching through the NVR and the polyether sulfone layer. Dalal, et al. discloses leaving the entire polyether sulfone layer intact, although it is desirable to have a pattern which is etched to the semiconductor substrate. Blanket deposition of a metallization layer thereby leaves a metallic stud deposited on top of the semiconductor substrate. Removal of the metallization, NVR, photoresist, and metallization layer is accomplished by dissolving the polyether sulfone layer using N-methylpyrrolidone (NMP) or other suitable solvent, thereby quickly lifting off these layers and leaving only the metal stud deposited on the substrate.

Referring now to FIG. 1A, the prior method for depositing metal studs includes the initial step of depositing a polyether sulfone layer 12 onto a semiconductor substrate 10. A novolak resin based positive resist layer 14 is then deposited onto the polyether sulfone layer 12. The positive resist layer 14 is then baked at a temperature range of about 210° C. to 230° C. in order to render it photo insensitive. Atop the resist layer 14 is deposited a photosensitive resist layer 16.

Referring now to FIG. 1B, the resist layer 16 is subjected to radiation and is developed in a manner well known in the prior art, to thereby provide a relief pattern image 18. The resist mask is then used to facilitate selective removal of the underlying layers 14 and 12 to expose a window 20 therein. It is to be noted that there may be millions of such windows formed atop the semiconductor substrate 10. Window 20 is merely exemplary of one such window. The technique of forming the windows and layers 14 and 12 is well known in the prior art.

Referring now to FIG. 1C, after the windows 18, 20 are formed, a metal layer 22 is blanket deposited over the entire structure, thereby forming a metal stud 24 onto semiconductor substrate 10 in window 20.

Referring now to FIG. 1D, the layers 14, 16, 22 are then quickly lifted off by using NMP or another suitable solvent to dissolve and release the polyether sulfone layer 12, thereby leaving the pattern metal stud 24 adhered to the surface of the semiconductor substrate 10. During the lift-off process, residue polyether sulfone (not shown) might remain and can be removed by dissolving it in a suitable solvent, such as NMP, in an additional step.

This method is unsuitable, however, because during the lift-off process the studs are damaged from the impact of the lift-off layers 12, 14, 16 and 22. One of the damage conditions is referred to as "tilted stud" and is illustrated in FIG. 1D. With this condition, the stud is still able to make electrical connection. However, the area of electrical connection is significantly reduced, thereby leading to a potentially unreliable connection some time in the future, when repairing such a defect or replacing the part is extremely expensive. It is evident from FIGS. 1A–1D that the lift-off structure has significantly more mass than the studs.

Dalal et al. therefore provides a method of forming metal studs by utilizing the sensitivity of a polyether sulfone underlay, which is first deposited onto the substrate, to NMP. This process is unacceptable for the smaller semiconductor structures utilized at the present time, however, because damage occurs to the studs during the lift off process. This is due to the fact that the studs comprise only a small percentage of the overall area of the substrate, with the structure which is lifted off taking up the remaining area. As a result, the structure comprising the polyether sulfone, NVR, photoresist and metallization layer collides with the metal studs during the lift off process, thereby causing impact damage to the studs. It is to be noted that damage to even a single metal structure is a potential reliability problem which warrants rejection of an entire chip.

A method of producing undamaged, reliable metallurgy which overcomes the deficiencies of the prior art, is therefore, highly desirable.

DISCLOSURE OF THE INVENTION

The object of the present invention is to provide for an improved method of forming patterned films on a semiconductor substrate which minimizes damage to the patterned material deposited.

According to the present invention a patterned film formation process includes the steps of depositing a polyether sulfone release layer; depositing a photoresist underlay; fluoridating the underlay; depositing an exposure photoresist layer; patterning a film pattern through the photoresist layer, underlay and release layer; depositing a film layer, thereby leaving a film in the patterned opening; applying an adhesive tape to the film layer; stripping the film and photo resist layers away from the underlayer; and, dissolving the underlayer and release layers utilizing a selective resist stripper.

The present invention provides for the formation of a dense film pattern deposited onto a semiconductor substrate, which is protected by the photoresist underlay during removal of the polyether sulfone and film layers. Consequently, the film pattern remains undamaged during the manufacturing processes after its formation, thereby improving manufacturing yields and device reliability.

These and other objects, features and advantages of the present invention will become more apparent in light of the detailed description of exemplary embodiments thereof as illustrated by the drawings.

BEST MODE FOR CARRYING OUT THE INVENTION

The present invention is a method of depositing patterned films onto a substrate. For example, the present invention may be utilized in the formation of metal contact studs onto a semiconductor substrate. A method of forming metal contact studs is described hereinafter, as illustrated in FIGS. 2A-2L, but it is understood that other types of both conductive and nonconductive patterned films, for instance metal wires, may be deposited utilizing the method of the present invention.

Figure 1A:
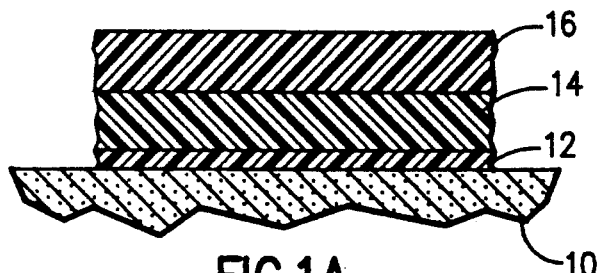
FIGS. 1A-1D are diagrammatic cross-sectional views of a structure being fabricated in accordance with the method of the prior art.
Figure 1B:
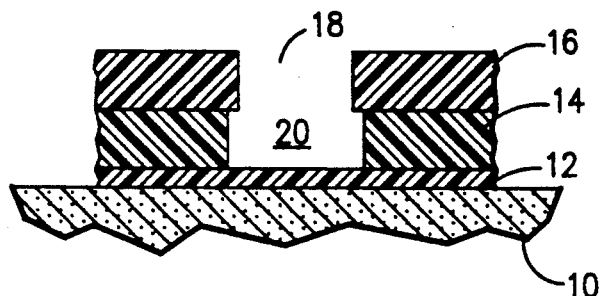
Figure 1C:
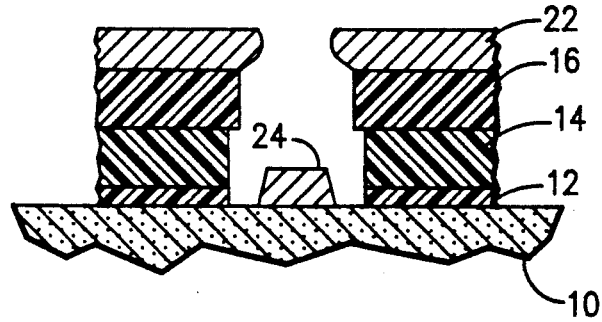
Figure 1D:
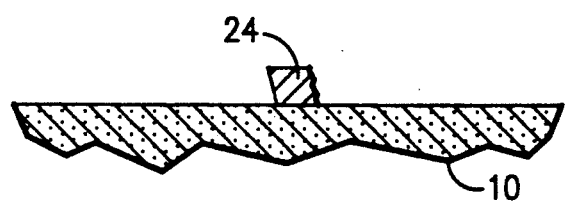
Figure 2A:
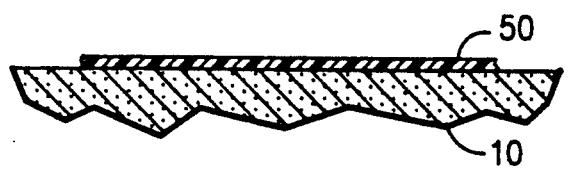
FIGS. 2A-2L are diagrammatic cross-sectional views of a structure being fabricated in accordance with the method of the present invention.

Referring now to FIG. 2A, the method for depositing metallurgy onto a semiconductor substrate of the present invention begins with spin-coating a release layer of polyether sulfone layer 50, about 2,000-3,000 Å thick, onto the semiconductor substrate 10. The polyether sulfone layer 50 is then baked on a hot plate at about 220° C. for approximately 5 minutes to remove all solvents.

Figure 2B:
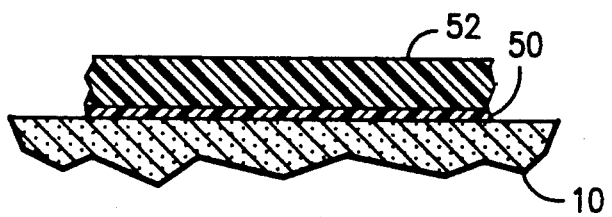

Referring now to FIG. 2B, a photoresist underlayer 52 is then deposited onto the polyether sulfone layer 50. The underlayer 52 may be comprised of any polymeric material used in coating which: a) exhibits good adhesion to the polyether sulfone layer 50; b) is thermally stable under the deposition conditions for the film to be patterned; c) is removable by reactive etching; and, d) is soluble in NMP or a selective resist stripper solution which will be described in greater detail hereinafter. Thermally stable means that the material doesn't flow, release gaseous products, physically distort or decompose under the conditions (specified herein) which the material will later be exposed to. The preferred material for the underlayer is an organic polymeric masking material, such as an AZ-1350 type polymer, which comprises a novolak type phenol-formaldehyde resin and a photosensitive cross-linking agent, and is commercially available from the Hoechst Celanese Corporation. Other suitable materials include synthetic resins such as polyvinyl cinemate and polymethyl methacrylate, diazo type photoresists and polyimides. The combined thicknesses of the underlayer 52 and the polyether sulfone layer 50 determine the height of the studs to be produced. In the present invention an underlayer of approximately 1.9-2.8 microns is suitable. The preferred method of the deposition of the underlayer 52 is by spin coating, although other deposition techniques known in the art may be utilized. After deposition, the underlayer 52 is baked on a hot plate at about 210° C. to 230° C. for about five minutes or in an oven from about 210° C. to 230° C. for about ten minutes in order to render it photoinsensitive.

Figure 2C:
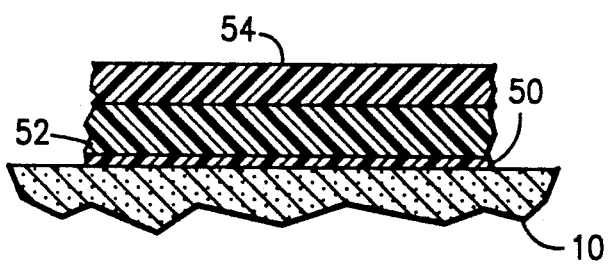

Referring now to FIG. 2C, a photosensitive resist layer 54, approximately 1 micron thick is then deposited by spin coating onto the underlayer 52. The resist layer 54 may be a material such as part number AZ4110 which is commercially available from the Hoechst Celanese Corporation.

Figure 2D:
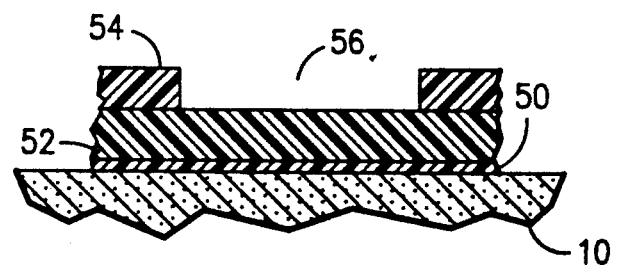

Referring now to FIG. 2D, the next step in the process of the present invention is to expose and develop a predetermined metallization pattern 56 through the photoresist layer 54 by any of a number of techniques well known in the prior art.

Figure 2E:
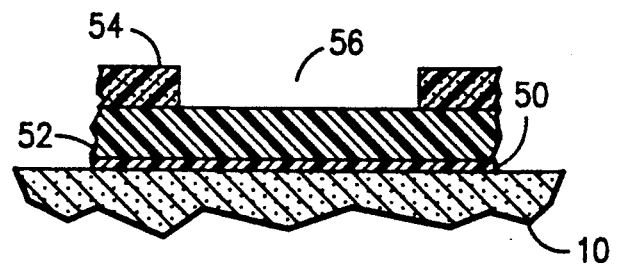

Referring now to FIG. 2E, the remaining photoresist layer 54 material is then conditioned in order to render it resistant to the reactive ion etching (RIE). The preferred method of conditioning is to silylate the photoresist 54 by immersing it in a heated solution (about 50° C.) of 10% hexamethylcyclotrisilazane (HMCTS) and 90% xylene for about ten to thirty minutes. Afterwards, the wafer is rinsed clean in an appropriate solvent, such as xylene, dried and then baked at about 160° C. to 210° C. for about thirty minutes.

Figure 2F:
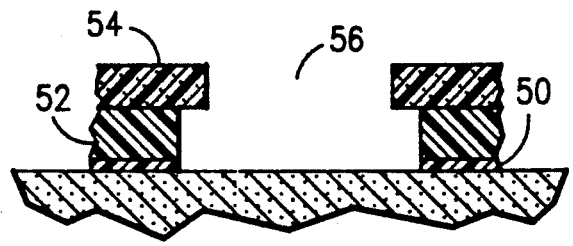

Referring now to FIG. 2F, the metallization pattern 56 is then transferred through the underlayer 52 and the polyether sulfone layer 50 by an oxygen RIE to thereby create a metallization pattern 58 which slightly undercuts the pattern 56 in the photoresist layer 54. Undercutting of the the pattern 56 assures that all material of layer 54 is removed in the locations of the desired openings.

It is to be noted that other techniques, not illustrated herein may be utilized to provide a metallization pattern to the substrate 10, in order to replace the steps illustrated in FIGS. 2D-2F. One such alternative technique includes the steps of: depositing an oxygen RIE resistant barrier layer (such as silicon nitrite, an organic spun on glass, or silicon dioxide) onto the underlayer 52; depositing a photosensitive resist layer, (such as mentioned above), onto the barrier layer; exposing and developing the metallization pattern through the photosensitive resist layer; transferring the pattern through the barrier layer using a CF₄ solution; and, transferring the pattern through the underlayer 52 and polyether sulfone layer 58 using an oxygen RIE.

Figure 2G:
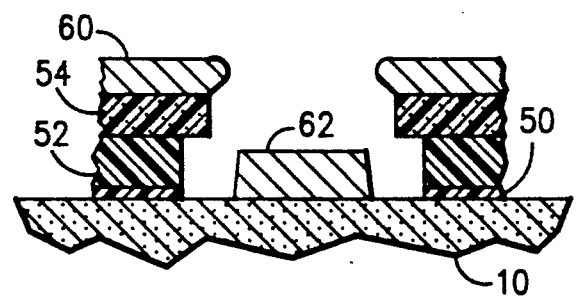

Referring now to FIG. 2G, the next step of the process of the present invention is blanket deposition of a metallization layer 60 over the existing structure. The deposition of metal layer 60 may be any of a number of methods well known in the prior art, such as evaporate-/ion or sputtering. The deposition step creates a metal stud 62 on the semiconductor substrate 10 in the opening 58.

It is to be noted that prior to the deposition of the metallization layer, various surface cleaning methods, such as Argon ion sputtering or buffered HF, may be utilized to improve electrical contact between the metallurgy and the substrate 10.

Although the preferred materials for the release layer 50, underlayer 52, and photoresist layer 54 are identified hereinbefore, it is to be understood that other compatible materials may be utilized. Substitute materials, however, must be thermally stable under the metal or film deposition conditions.

Figure 2H:
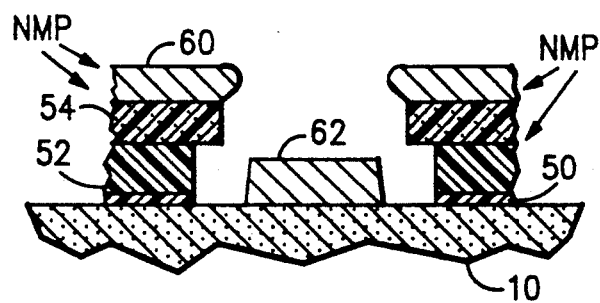

Referring now to FIG. 2H, the wafer is then immersed in a NMP bath at room temperature for about 10 seconds. The wafer is then rinsed and dried in a Freon TF vapor. Freon TF is a trademark of the Dupont Corporation. The NMP bath conditions the polyether sulfone layer 50 and weakens its mechanical bonding strength, thereby facilitating a lift-off step which is described hereinafter.

Figure 2I:
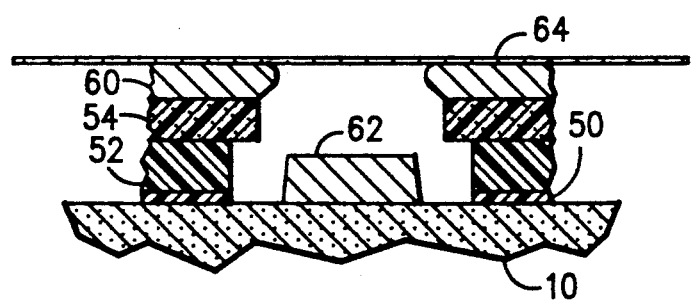

Referring now to FIG. 2I, an adhesive backed polymer film or tape 64, such as part number 850 manufactured by the 3M Corporation is then applied to the top of the metallization layer 60.

Figure 2J:
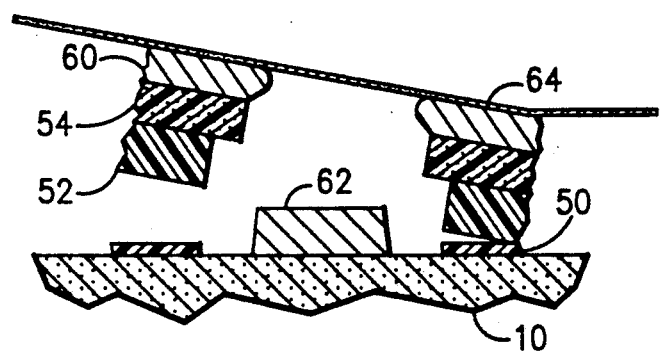

Referring now to FIG. 2J, a pulling/stripping force is then applied to the tape 64 to thereby pull the metallization layer 60, the photoresist layer 54, and the underlayer 52 away from the release layer 50. The bond between the layers 50 and 52 is broken because of the NMP conditioning step hereinbefore described and illustrated in FIG. 2H. The mechanical bond between the release layer 50 and the underlayer 52 is weaker than the mechanical bonds between layers 52, 54, 60 and 64. The underlayer 52, photoresist layer 54 and metallization layer 60 are therefore stripped away from the release layer 50.

Figure 2K:
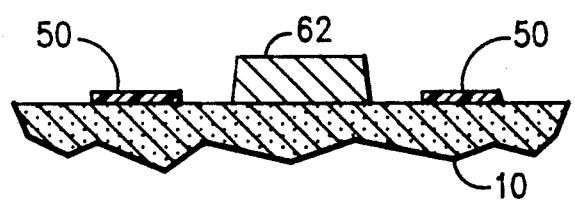

Referring now to FIG. 2K, the structure remaining after the tape stripping step includes the metallurgy 62 and a residue polyether sulfone layer 50.

Figure 2L:
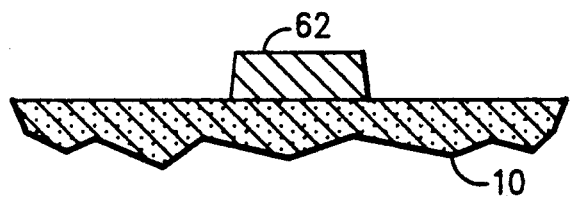

Referring now to FIG. 2L, the residue polyether sulfone layer 50 is then removed from the substrate by immersing the wafer in a NMP bath as is disclosed in the aforementioned Dalal, et al. patent. Alternatively, the polyether sulfone layer 50 may be dissolved by immersing the wafer in a photoresist stripper composition such as N-alkly-2-pyrrolidone, 1, 2-propanediol and tetraalkylammonium, hydroxide. Commonly owned U.S. patent application Ser. No. 07/517,105 (filed on May 1, 1990) discloses the preferred photoresist stripper composition to be utilized in removing the polyether sulfone layer 50, and is incorporated in its entirety herein by reference. The preferred photoresist composition for the process of the present invention comprises 60-90% by-weight of a N-alkly-2-pyrrolidone; 10-14% of 1, 2-propanediol; and, a sufficient amount of tetraalkylammonium, hydroxide to provide a solution being from 0.1 to 0.22N. The wafer should be immersed in the stripper composition at a temperature of about 105° C. to 135° C. for more than fifteen minutes. The substrate must then be rinsed and cleaned using methods well known in the prior art.

Although the invention has been shown and described with exemplary embodiments thereof, it should be understood by those skilled in the art that the foregoing and various other changes, omissions and additions may be made therein and thereto without departing from the spirit of the scope of the invention.

What is claimed is:

1. A method of forming a patterned film of a desired film material onto a substrate according to a predetermined film pattern and under film deposition conditions corresponding to the desired film material, said method comprising the steps of:
    a) depositing a release layer of a release material onto a surface of the substrate, wherein said release material is thermally stable under the film deposition conditions and is soluble in at least a first or a second solution;
    b) depositing an underlayer onto said release layer, wherein said underlayer is thermally stable under the film deposition conditions and said underlayer is mechanically bonded to said release layer by a first mechanical bonding strength;
    c) patterning the predetermining film pattern through said underlayer and said release layer thereby forming a patterned underlayer and a patterned release layer and further exposing the substrate surface according to the predetermined film pattern;
    d) depositing film layer onto said patterned underlayer and the exposed substrate, thereby forming the patterned film onto the exposed surface of the substrate according to the predetermined film pattern and wherein said film layer is mechanically bonded to said patterned underlayer by a second mechanical bonding strength;
    e) weakening the first mechanical bonding strength of said release layer, wherein the weakened first mechanical bonding strength is weaker than the second mechanical bonding strength;
    f) applying an adhesive backed tape to the top of said film layer, said adhesive backed tape not contacting the patterned film;
    g) applying a pulling force to said tape to break the mechanical bond between said underlayer and said release layer, thereby stripping said film layer and said patterned underlayer away from said patterned release layer, while leaving said patterned film and said patterned release layer on the substrate; and,
    h) removing said patterned release layer.

2. A method of forming a patterned film onto a substrate according to claim 1, wherein step e) comprises immersing said patterned release layer in said first solution.

3. A method of forming a patterned film onto a substrate according to claim 2, wherein said first solution is comprised of N-methylpyrrolidone (NMP).

4. A method of forming a patterned film onto a substrate according to claim 1, wherein step h) comprises dissolving said patterned release layer in said second solution.

5. A method of forming a patterned film onto a substrate according to claim 4, wherein said second solution is comprised of N-methyl-2-pyrrolidone, 1,2-propanediol, and tetraalkylammonium hydroxide.

6. A method of forming a patterned film onto a substrate according to claim 4, wherein said second solution is comprised on the order of:
   a) 60–90% by weight of a N-methyl-2-pyrrolidone;
   b) 10–40% by weight of a 1,2-propanediol; and,
   c) a sufficient amount of a tetraalkylammonium hydroxide to provide a solution being from 0.1 to 0.22 N.

7. A method of forming a patterned film onto a substrate according to claim 4, wherein said second solution is comprised of N-methylpyrrolidone (NMP).

8. A method of forming a patterned film onto a substrate according to claim 1, wherein step c) comprises the steps of:
   a) depositing a patterning resist layer (PRL) onto said underlayer;
   b) patterning said PRL according to the predetermined film pattern;
   c) conditioning said PRL to be resistant to an image transfer process; and,
   d) transferring the predetermined film pattern to said underlayer and said release layer.

9. A method of forming patterned films onto a substrate according to claim 1, wherein step c) comprises the steps of:
   a) depositing a barrier layer (BL) which is resistant to oxygen RIE onto said underlayer;
   b) depositing a patterning resist layer (PRL) onto said BL;
   c) patterning said PRL according to the predetermined film pattern;
   d) transferring the predetermined film pattern through said BL using a $CF_4$ RIE; and,
   e) transferring the predetermined film pattern to said underlayer and said release layer.

10. A method of forming a patterned film onto a substrate according to claim 1, wherein step d) is comprises of depositing evaporated metal.

11. A method of forming a patterned film onto a substrate according to claim 1, wherein the patterned film is comprised of metal and step d) is comprised of a CVD process.

12. A method of forming a patterned film onto a substrate according to claim 1, wherein the patterned film is comprised of metal and step d) is comprised of a sputtering process.

13. A method of forming patterned films onto a substrate according to claim 1, wherein said release material is comprised of polyether sulfone.

14. A method of forming patterned films onto a substrate according to claim 1, wherein said underlayer is comprised of an organic polymer.

15. A method of forming patterned films onto a substrate according to claim 1, wherein said underlayer is comprised of an organic polymeric masking material.

16. A method of forming a patterned film onto a substrate according to a predetermined film pattern, said method comprising the steps of:
   a) depositing a release layer of polyether sulfone onto a surface of the substrate;
   b) depositing an underlayer of an organic polymeric masking material onto said release layer, said underlayer being mechanically bonded to said release layer by a first mechanical bonding strength;
   c) patterning the predetermined film pattern through said underlayer and said release layer, thereby forming a patterned underlayer and a pattered release layer and further exposing the substrate surface according to the predetermined film pattern;
   d) depositing a film layer onto said patterned underlayer and exposed substrate thereby forming the pattered film onto the exposed surface of the substrate according to the predetermined film pattern, and wherein said film layer is mechanically bonded to said patterned underlayer by a second mechanical bonding strength;
   e) immersing said release layer in a solution comprised of N-methylpyrrolidone (NMP), thereby weakening the first mechanical bonding strength thereof, wherein the weakened first mechanical bonding strength is weaker than the second mechanical bonding strength;
   f) applying an adhesive tape to the top of said film layer, said adhesive tape not contacting the patterned film;
   g) applying a pulling force to said tape to break the mechanical bond between said underlayer and said release layer, thereby stripping said film layer and said patterned underlayer away from said patterned release layer and leaving the patterned film on the substrate; and,
   h) dissolving said patterned release layer.

17. A method of forming a patterned film onto a substrate according to claim 16, wherein step h) comprises dissolving said release layer in a solution comprising N-methyl-2-pyrrolidone, 1,2-propanediol, and tetraalkylammonium hydroxide.

18. A method of forming a patterned film onto a substrate according to claim 16, wherein step h) comprises dissolving said release layer in a solution comprising N-methylpyrrolidone (NMP).

* * * * *